United States Patent [19]

Reed

[11] 4,203,510
[45] May 20, 1980

[54] PNEUMATIC DIVERTER FOR HYBRID THICK FILM SUBSTRATE PROCESSING EQUIPMENT

[75] Inventor: Charles J. Reed, Corrales, N. Mex.

[73] Assignee: GTE Automatic Electric Laboratories Incorporated, Northlake, Ill.

[21] Appl. No.: 912,269

[22] Filed: Jun. 5, 1978

[51] Int. Cl.$^2$ .......................................... B65G 47/26
[52] U.S. Cl. .................................... 198/437; 198/438
[58] Field of Search .............. 198/436, 437, 438, 493; 406/86, 87, 88, 181

[56] References Cited

U.S. PATENT DOCUMENTS

| | | | |
|---|---|---|---|
| T927,006 | 10/1974 | Goverts | 406/88 X |
| 3,180,688 | 4/1965 | Futer | 406/88 |
| 3,614,168 | 10/1971 | Range | 406/88 X |
| 3,685,632 | 8/1972 | Brady | 406/88 |
| 3,918,706 | 11/1975 | Craft | 406/87 X |
| 3,976,330 | 8/1976 | Babinski et al. | 406/88 X |

*Primary Examiner*—James L. Rowland
*Attorney, Agent, or Firm*—Russell A. Cannon

[57] ABSTRACT

In a thick film screen printer having a chute that is alternately in a horizontal position for receiving a screened substrate at one location on it and inclined downward to slide the screened substrate onto a conveyor belt, a pair of elongated openings extend through the chute at the one location. The broad side edges of the openings are generally parallel to each other and the direction that substrates slide off the chute. These broad edges are also inclined with respect to the top surface of this chute so the openings generally face toward each other. A stream of air is passed through one and then the other of these openings to alternately move substrates over them toward opposite sides of the chute so that they slide onto different transverse locations on the belt.

1 Claim, 10 Drawing Figures

PNEUMATIC DIVERTER FOR HYBRID THICK FILM SUBSTRATE PROCESSING EQUIPMENT

BACKGROUND OF INVENTION

This invention relates to hybrid circuit manufacturing techniques and more particularly to a pneumatic diverter for moving screened substrates in thick film printers.

In the manufacture of hybrid circuits, the practice is to locate a ceramic substrate on the platen of a table in a thick film screen printer, the table then moving forward where a layer of resistive, conductive, electrical or protective material, for example, is screened on the substrate. As the table moves rearward, the screened substrate is wiped off of the platen and onto a horizontally positioned chute of the printer. As the table again moves into position for screening the next substrate, the chute automatically tilts and the previously screened substrate slides directly onto a conveyor belt. Since such equipment normally places screened substrates in a straight line on the belt, the speed at which the conveyor may operate limits the speed at which the printer can operate without it depositing screened substrates on top of each other on the belt. A prior-art method for increasing the speed at which the printer may operate, without changing the speed of the conveyor, is to periodically mechanically move the chute sideways before it is tilted in order to place screened substrates adjacent opposite sides of the belt. This technique is relatively complex and cumbersome. Also, since substrates are made of ceramic, fine particles of highly abrasive material are continually deposited on the chute. They may cause fouling of and excessive wear in parts of such a mechanical structure.

An object of this invention is the provision of a diverter for substrates in thick film screen printers which is relatively simple and free of fouling and wear.

SUMMARY OF INVENTION

In accordance with this invention, hybrid thick film processing equipment wherein processed substrates are sequentially moved to a first location on a raised chute that is subsequently tilted for sliding a processed substrate there in a first direction to a second location on a conveyor belt which transports it away from the equipment in a second direction that may be different from the first direction includes: the improvement, for locating a substrate at a third location on the belt that is spaced generally transversely of the second location, wherein the chute has a first opening through it at the first location, and has first means selectively producing a supply of pressurized gas under the first opening for passing a stream of gas through it in the direction of and generally at an angle $\theta$ with respect to the top surface of the chute for moving a substrate located at the first location and over the first opening in a third direction that is generally transverse to the first direction while on the chute, tilting of the chute causing the moved substrate to be deposited in the third location on the belt.

DESCRIPTION OF DRAWINGS

This invention will be more fully understood from the following detailed description of preferred embodiments thereof, together with the drawings in which.

DESCRIPTION OF PREFERRED EMBODIMENTS

Figure 1:
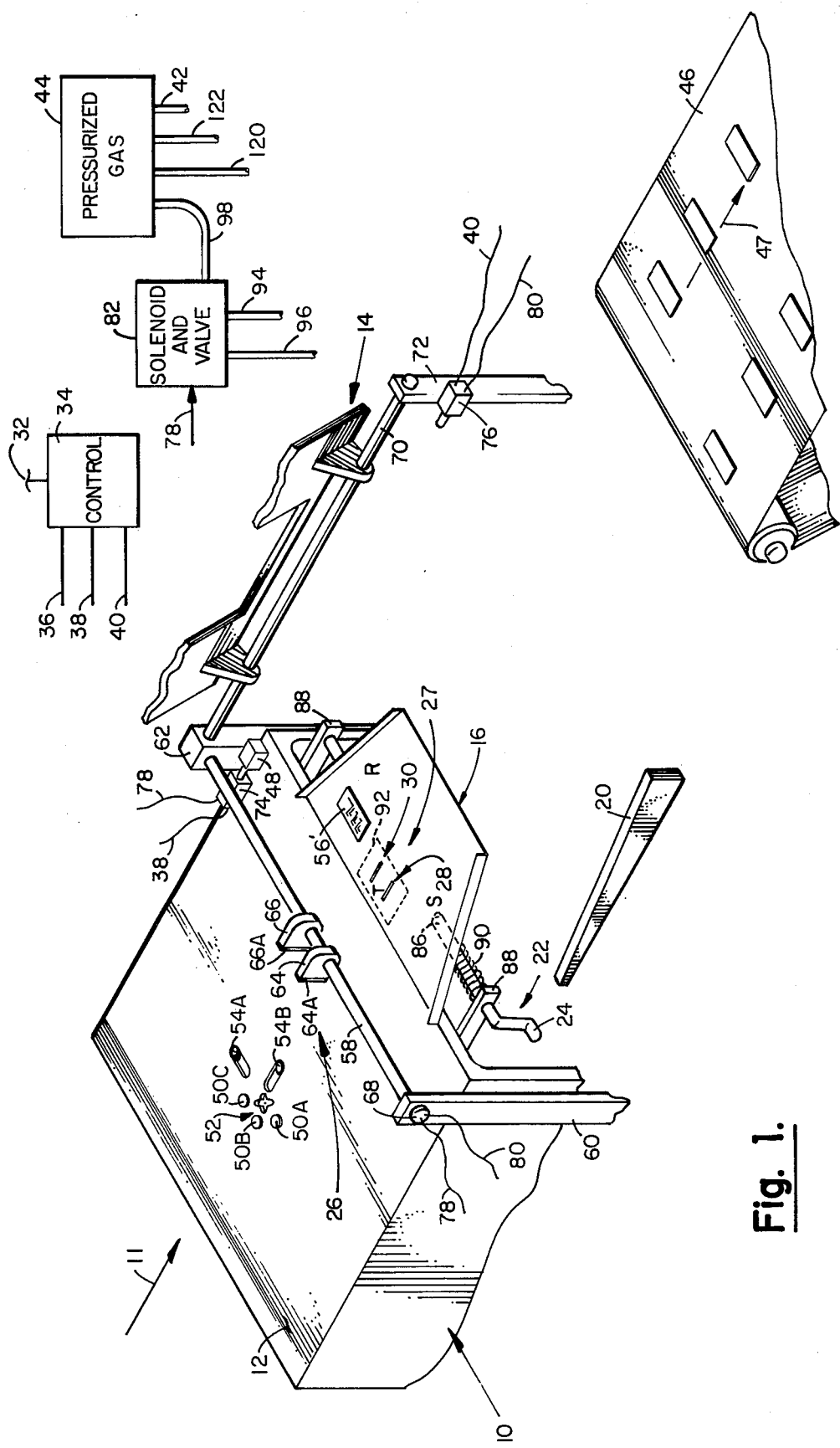
FIG. 1 is a perspective view of a thick film screen printer including a moveable table 10 in its rearward position, with pads 64A and 66A raised above a platen 12 and a chute 16 shown rotated horizontal and in the plane of the platen: a frame 14 for supporting a thick film screen being shown cut away here and in a raised position for simplicity of illustration.
Figure 2:
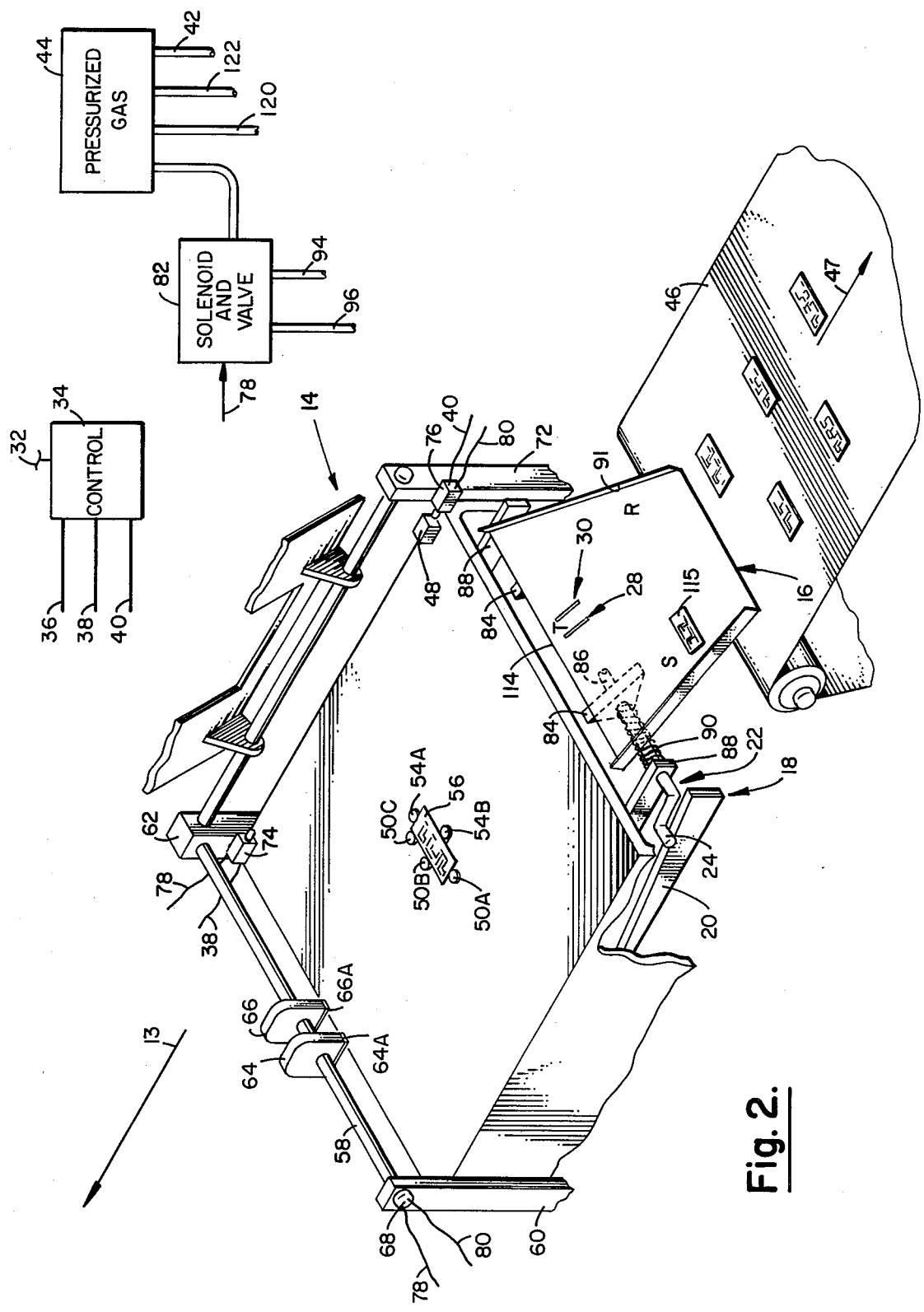
FIG. 2 is a perspective view of the printer with the moveable table 10 in its forward position, the pads 64A and 66A being rotated proximate the platen 12 and the chute 16 being inclined at an angle with respect to a conveyor belt 46.
Figure 3:
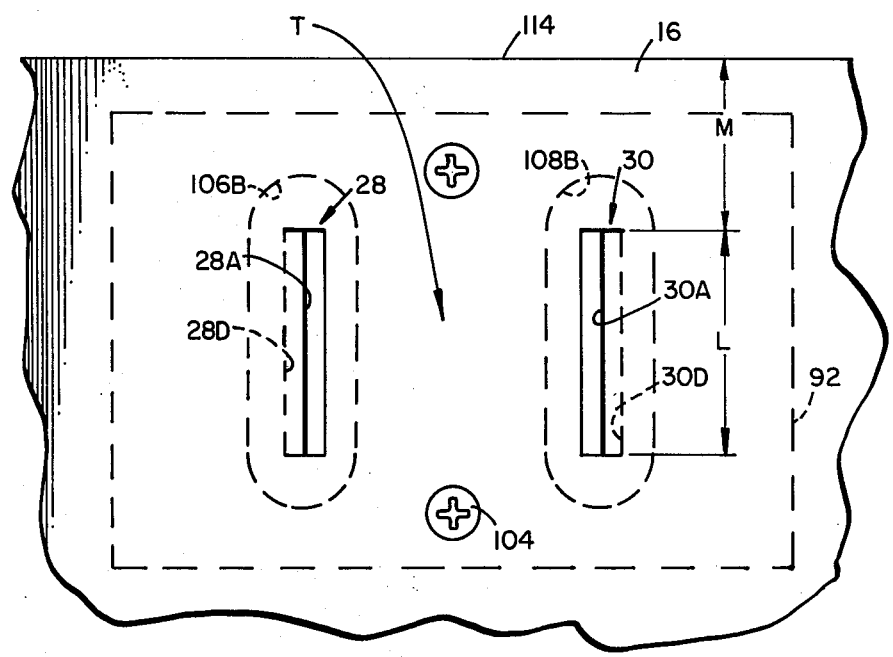
FIG. 3 is an enlarged top view of the central portion T of the chute 16.
Figure 4:
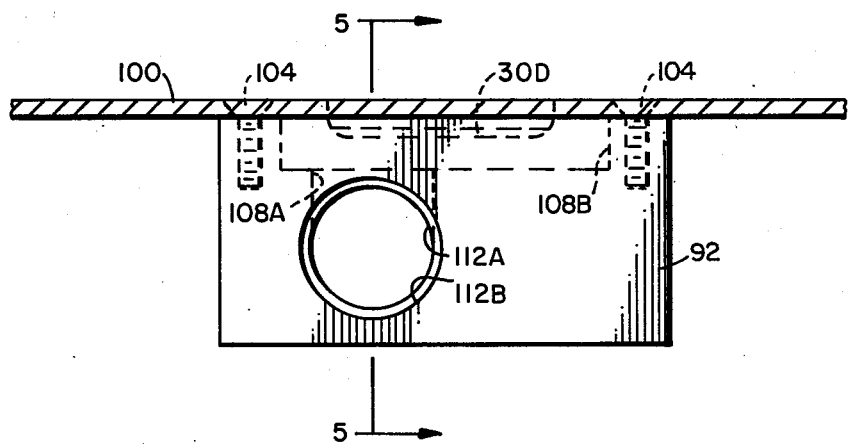
FIG. 4 is a right-side view in FIG. 3.
Figure 7:
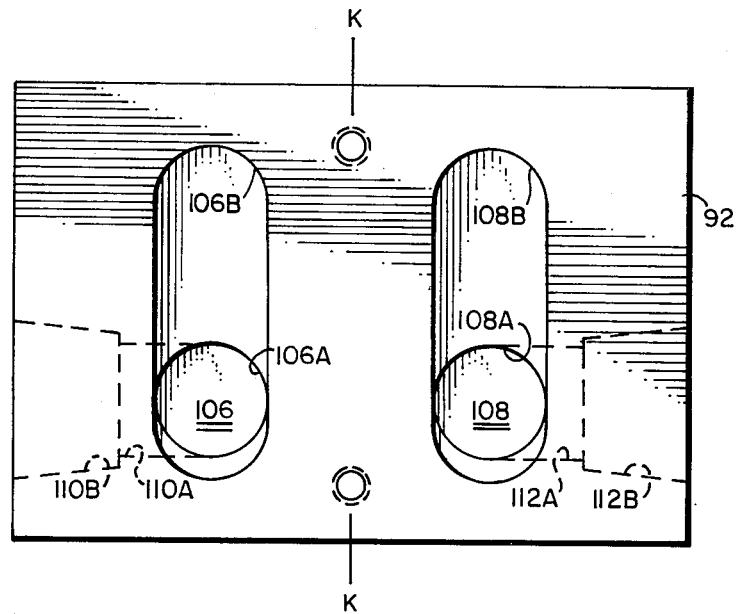
FIG. 7 is a top view of the manifold 92 in FIG. 3.

A thick film screen printer embodying this invention is illustrated in FIGS. 1 and 2 and generally comprises a moveable table 10 having a top surface or platen 12 on which substrates are located; a frame assembly 14 for holding a thick film screen (not shown); a chute 16 associated with a tilt mechanism 18 including a cam 20 and cam follower 22 for selectively causing rotation of the chute to a horizontal-raised position and tilting of the chute; and ejector mechanism 26 for sliding screened substrates off of the platen and onto the horizontal chute; and pneumatic diverter means 27 including a pair of elongated openings 28 and 30 in the chute. The printer itself, exclusive of the pneumatic diverter means 27, is similar to the "ami" Model CP88 Thick Film Screen Printer manufactured by the PRESCO DIVISION of "affiliated manufacturers, inc.", of Northbranch, New Jersey. This printer is designed so that table 10 moves forward and back in the direction of arrows 11 and 13 on cylindrical bushings (not shown) during a cycle of operation that is initiated by an operator pressing a switch 32 on control box 34. The table in this printer is driven pneumatically by pressurized gas from source 44 which is connected on line 42 to drive means (not shown). The table is located proximate a conveyor belt 46 so that the chute is over the belt in its forward position in FIG. 2. It has a block member 48 mounted on the front right edge of the platen 12. It also has three fixed pins 50, a pair of crossed slots 52, and a pair of moveable pins 54 centrally located on it (see FIG. 1). A substrate 56 is initially set on the platen with a pair of adjacent sides contacting pins 50 in FIG. 1. When the switch 32 is actuated, a signal on line 36 causes equipment (not shown) to create a vacuum in the slots 52 which holds the substrate 56 as it causes pins 54 to move against the other two sides thereof to fix the position of the substrate.

The frame 14 is shown cut away and in its raised position since its structure and operation are conventional and are not important to an understanding of this invention. It is attached to a shaft 70 which is rotatably mounted in stationary vertical members 62 and 72. When the printer is operated to screen substrates, the frame assembly 14 is rotated to move a screen in it into a plane that is proximate to and parallel to the platen.

The ejector assembly 26 comprises a shaft 58 which is rotatably supported in fixed upright members 60 and 62; a pair of clamps 64 and 66 that are securely attached to shaft 58 and which have nylon pads 64A and 66A thereon; a drive motor 68; and a pair of limit switches 74 and 76. The limit switches are mounted on the sides of members 62 and 72 so that they are above the platen and face each other. Output lines 38 and 40 from control circuit 34 are connected to switches 74 and 76, respectively. Output lines 78 and 80 of these switches are connected to the drive motor 68. The output line 78 of switch 74 is also connected to a solenoid and valve means 82. The member 48 actuates switches 76 and 74 for causing motor 68 to rotate shaft 58 counterclockwise and clockwise, respectively. This causes the pads 64A and 66A to move away from and proximate to the platen when the table is in its rearward and forward positions in FIGS. 1 and 2, respectively.

The chute 16 is attached to flanges 84 which are rigidly connected to a shaft 86. This shaft is rotatably supported in brackets 88 that are rigidly secured to the table. The cam follower 22 is mounted in the left side of shaft 86 and has an arm 24 which rides on the inclined surface of cam 20. As the table moves forward in FIG. 1, it causes the chute to tilt in the direction of the belt (see FIG. 2). A torsion spring 90 is located on shaft 86 to return the chute to its horizontal positon as the table moves rearward in FIG. 2. The brackets 84 support the chute so that its top surface is in the same plane as the platen when the chute is in its horizontal position. The sides 91 of the chute are turned up so as to limit transverse movement of substrates on the chute.

The conventional operation of this printer will now be briefly described. With the table in its rearward position in FIG. 1, the member 48 actuates limit switch 74 which causes the control box to pass a signal current on lines 38 and 78 that causes motor 68 to rotate ejector bar 58 clockwise and pads 64A and 66A away from the platen. After a substrate 56 is located on the platen with respect to pins 50, switch 32 is actuated to produce a signal on line 36 that causes equipment (not shown) to move the other pins 54 against the substrate to fix its position there. The table then automatically moves to its forward position, with the follower arm 24 moving up the cam 20 to tilt the chute and cause any substrate on it to slide onto the belt. With the table forward in FIG. 2, the member 48 actuates limit switch 76 to cause control box 34 to pass a signal current on line 80. This causes motor 68 to now rotate ejector bar 58 counterclockwise and pads 64A and 66A adjacent to the platen at a position behind the substrate 56 in FIG. 2. After a prescribed time interval for a screening operation, the table again moves rearward. As the spring 90 returns the chute to its horizontal position, the pads 64A and 66A wipe the screened substrate in FIG. 2 off of the platen and onto the center portion T of the horizontal chute in FIG. 1. When member 48 contacts limit switch 74, the motor 68 again operates to move the pads above the platen and out the way of a substrate. During each such cycle of operation, a screened substrate is deposited in the center of the belt.

Figure 5:
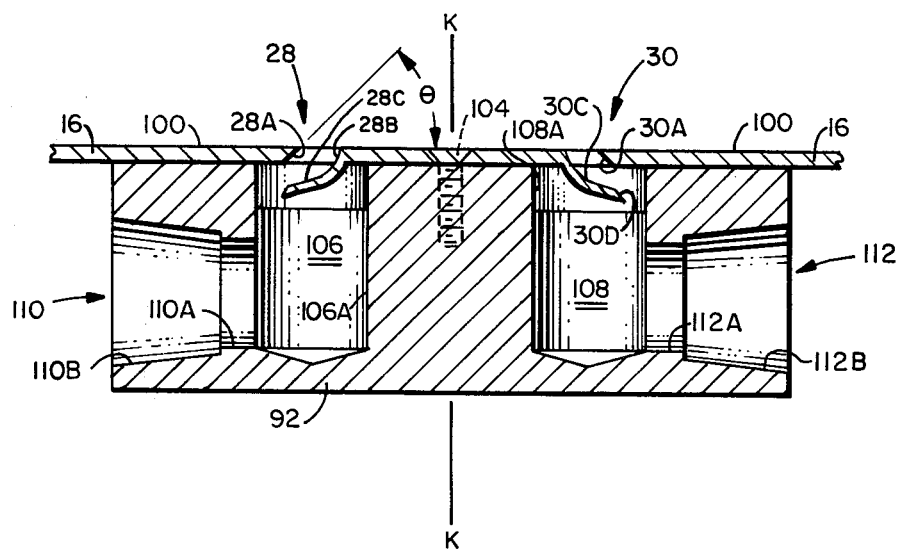
FIG. 5 is a section view taken along line 5—5 in FIG. 4.

The pneumatic diverter 27 comprises the pair of elongated-angulated openings 28 and 30 in the chute and a manifold 92 on the bottom of the chute. The manifold is connected through hoses 94 and 96 to the solenoid and valve means 82 which is connected by hose 98 to the source 44 of pressurized gas. The elongated openings 28 and 30 and manifold. 92 are shown in greater detail in different ones of the FIGS. 3–7. The openings 28 and 30 are preferably essentially parallel to each other. The elongated edges defining these openings and designated by numerals with the letters A and D generally make an angle $\theta$ with respect to the top surface 100 of the chute (see FIG. 5). Each of the openings 28 and 30 is formed by drilling a very small hole through the chute at the angle $\theta$. A rotary milling cutter is then located in the hole, oriented at the angle $\theta$, and moved against the chute over a distance L that is equal to the desired length of the openings. The angle $\theta$ is preferably small, but may be limited by milling equipment. This length L is also equal to the mean width of substrates to be processed by the printer. The top surface 100 of the chute adjacent to the inside broad edges 28B and 30B of the milled slots and center line K—K are then lanced with a probe to increase the width of the milled slots and to provide depth G and baffle type deflection surfaces 28C and 30C on the formed inside edges of the openings. Alternatively, separate baffle plates or ribs may be attached to the bottom of the chute. The baffle surfaces facilitate exiting pressurized gas from the openings 28 and 30 at an angle of less than $\theta$. The outside broad edges 28A and 30A of the milled slots may also be lanced to remove material there so that the bottoms of edges 28A and 30A generally make an angle of less than $\theta$ with respect to the top surface 100.

The manifold 92 is attached to the bottom of the chute by flat head screws 104. The manifold is essentially a block of aluminum, for example, having a pair of spaced apart plenumns 106 and 108 in it. The plenums have tapered openings 110 and 112 extending into them from the sides thereof. The plenums are formed by drilling holes 106A and 108A in the block and routing elongated slots 106B and 108B in the top surfaces thereof over a length that is greater than that of the openings 28 and 30 and is wider than the effective width E of these openings. Holes 110A and 112A are then drilled in opposite sides of the block and milled out to provide tapered openings 110B and 112B for receiving hoses 94 and 96 that connect associated plenums to the solenoid and valve means 92 and thus to gas in source 44. The valve means 82 is responsive to signal currents passed on line 78 by limit switch 74 for alternately connecting pressurized gas to plenums 106 and 108 and thus to the openings 28 and 30, respectively.

Consider that table 10 is in its forward position in FIG. 2 with pads 64A and 66A rotated proximate the platen and switch 74 causing valve means 82 to connect pressurized gas to the left opening 28. With the chute 16 tilted by the operation of cam 20 and follower 22, any substrate 115 on the left side S, for example, of the chute slides onto the left side of the belt. After the substrate 56 in FIG. 2 is screened, the table moves rearward to cause pads 64A and 66A to wipe the screened substrate 56 onto the center portion T of the horizontal chute and over both of the elongated openings 28 and 30. The pressurized gas passed through the left opening 28 has a vertical component which reduces friction between the substrate and the chute, and has a horizontal component which moves it to the right side R of the chute (the element 56' in FIG. 1). With the table rearward, limit switch 74 passes a signal current which causes drive motor 68 to rotate the ejector bar to raise the pads above the platen. This signal on line 78 also causes the solenoid and valve means 82 to now connect pressurized gas to the other hose 96 and thus to the right opening 30 in the chute.

After an operator loads the next substrate (not shown) onto the platen and actuates switch 32, the table again moves forward. As the follower arm 24 traverses cam 20, the chute is gradually tilted so that the substrate 56' slides down the right side R of the chute and onto the right side of the belt. When the member 48 actuates limit switch 76, it causes motor 68 to rotate the ejector bar to move the pads proximate the platen. After inking of the next substrate, the table moves rearward, the chute is rotated horizontal, and the next inked substrate (not shown) is wiped onto the center T of the chute. The stream of air which now passes through the right opening 30 in the chute causes this next substrate to move to the left side S thereof and then onto the left side of the belt when the table again moves forward. In this manner, pressurized gas is alternately connected to one and then the other of the openings 28 and 30 for alternately placing inked substrates on opposite sides of the belt 46.

A machine embodying this invention in which the elongated openings 28 and 30 were substantially identical, were parallel to each other, and were facing each other was successfully built and operated. The spacing E between broad top edges 30A and 30B of the opening 30 was 0.12 inch whereas the spacing F between parallel extensions of edges 30A and 30D was approximately 0.022 inch. The spacing D between the inside edge 30B and the center line K—K was 0.42 inch. The lanced surface 30C had a radius of approximately 0.12 inch and a depth G of approximately 0.030 inch. The openings had lengths L=0.56 inch and were spaced a distance M=0.06 inch from the top edge 114 of the chute. The edges 28A and 30A of the openings made any angle $\theta$ of approximately 45° with respect to the top surface 100 of the chute which was effectively reduced by the baffle surfaces 28C and 30C. The gas in source 44 of this machine was air under a pressure of 12-20 pounds per square inch (psi). Alternatively, the gas may be dry nitrogen if this is found necessary. This diverting means operated satisfactorily on substrates having a nominal width of 1 inch (measured in the direction of arrow 11 in FIG. 1) and transverse lengths of approximately 3 inches.

Figure 8:
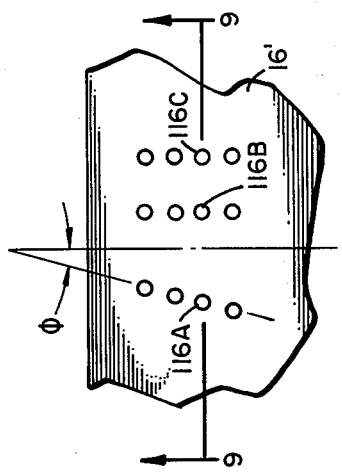
FIG. 8 is an enlarged top view of the central portion T of a chute 16' including alternate embodiments of this invention.
Figure 9:
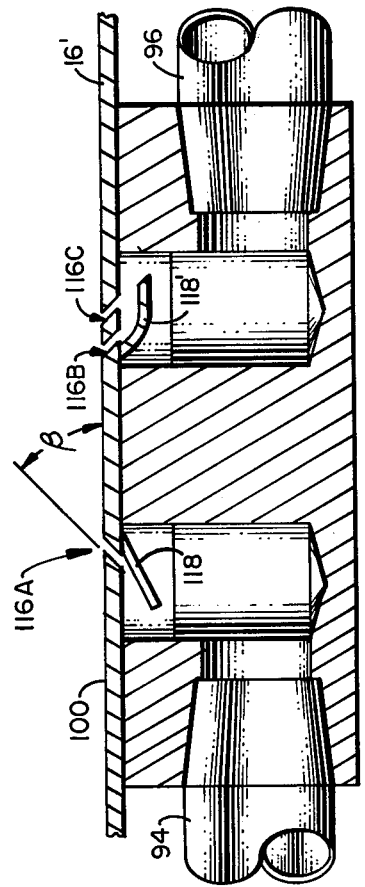
FIG. 9 is an enlarged section view taken along line 9—9 of FIG. 8 and illustrating alternate embodiments of this invention.

In the alternate embodiment of this invention in FIGS. 8 and 9, each of the elongated openings 28 and 30 is replaced with a plurality of holes 116 that are arranged in rows with axes oriented at the angle $\beta$ with respect to the top surface 100 of the chute 16'. The angle $\beta$ is preferably small, in the order of 20°. The diameters of these holes 116 may be greater than the width of openings 28 and 30. A narrow defelector bar, baffle, or rib 118 may be attached to the bottom of the chute in each plenum of the manifold, where this structure is found to be necessary. The rows of holes here also face each other so that air simultaneously directed through them would generally meet along a line between them. Alternatively, the holes of each row may be oriented so that they face in opposite directions. Further, a number of adjacent rows of holes 116B and 116C, which are preferably parallel to each other, may be associated with each plenum in the manifold for providing additional lift and force for moving substrates. Also, rows of holes 116A may be oriented at an angle $\phi$ with respect to the centerline K—K.

Figure 10:
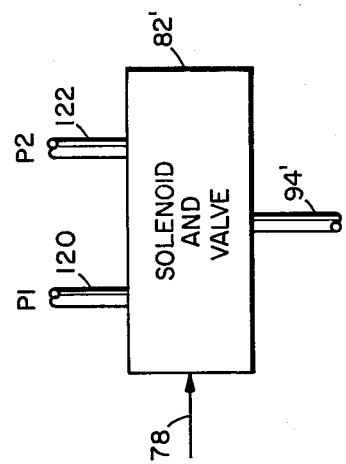
FIG. 10 is a block diagram representation of a solenoid and valve means 82' of a further embodiment of this invention.
Figure 6:
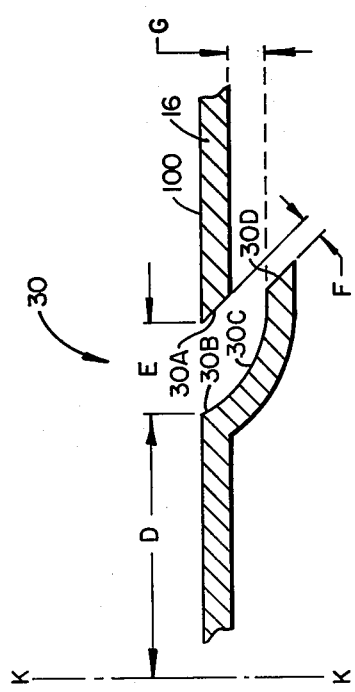
FIG. 6 is a greatly enlarged elevation view of the opening 30 in FIG. 5.

In another embodiment of this invention in FIG. 10, a hose 94' connects the plenum 106 associated with the left opening 28, for example, to solenoid and valve means 82' having a first hose 120 receiving gas of a first pressure P1 and a second hose 122 receiving gas of a second pressure P2 which is less than P1. The solenoid and valve means 82' is responsive to a first occurring signal current on line 78 for connecting air of the first pressure P1 to plenum 106 and opening 28 to move a substrate located over it a first prescribed distance in the direction of the right side R of the chute. The valve means 82' is responsive to a second occurring signal current on line 78 for connecting air of the second pressure P2 to the same plenum 106 and opening 28 for then moving the next substrate over the latter a second prescribed distance in the direction of the right side R of the chute which is less than the first prescribed distance. In this manner, a number of inked substrates can be moved to the same side of the chute at an increased rate without having them interfere with each other as they slide onto the conveyor belt.

Although this invention is described in relation to preferred embodiments thereof, variations and modifications will occur to those skilled in the art. By way of example, the table may be stationery and the ejector means 26 moveable for wiping screened substrates off of the platen and onto the horizontal chute. Also, a pair of elongated rectangular slots that are much wider than the openings 28 and 30 may be formed in the chute. The desired openings 28 and 30 may then be formed in projections on top of the manifold which are located in the rectangular slots. Further, each of the elongated openings 28 and 30 may be oriented at an angle with respect to the directions 11 and 13 in which the table moves. Additionally, the openings 28 and 30 may be oriented so that they face away from each other. Also, a number of substrates may be simultaneously located at different positions on the chute prior to its tilting to slide them onto the belt. Additionally, the table and chute may be oriented so that screened substrates are wiped onto the chute in a direction parallel to the axis about which the chute rotates (e.g., the substrates may be moved onto the left sides of the chute in FIG. 1 in a direction transverse to the arrow 11). Also, the belt may be oriented at an angle with respect to the direction 11 and 13 of motion of the table and tilting of the chute. Further, a solenoid and valve means may be employed to pass an air stream selectively through either one of or none of the elongated openings to sequentially locate substrates at different positions on the belt. Other sequences of connecting pressurized air to ones or none of the elongated openings for selectively moving only certain substrates on the chute for locating them in a prescribed sequence of transverse positions on the belt will occur to those skilled in the art. The scope of this invention is therefore to be determined from the attached claims rather than from aforementioned detailed descriptions of preferred embodiments here.

What is claimed is:

1. In hybrid thick-film processing equipment wherein processed substrates are sequentially moved to a first location on a raised chute that is subsequently tilted for sliding a processed substrate there in a first direction to a second location on a conveyor belt which transports it away from the equipment in a second direction that may be different from the first direction: the improvement, for locating a substrate at a third location on the belt that is spaced generally transversely of the second location, wherein the chute has a first opening through it at the first location, and including first means selectively producing a supply of pressurized gas under the first opening for passing a stream of gas through it in the direction of and generally at an angle $\theta 1$ with respect to the top surface of the chute which is sufficient for moving a substrate located at the first location and over the first opening in a third direction that is generally transversely of the first direction while on the chute, tilting of the chute causing the moved substrate to be deposited in the third location on the belt; saif first means being selectively operative at one time for producing a supply of gas of a first pressure under the first opening for moving one substrate over it a first distance in the third direction, and is selectively operative at another time for producing a supply of gas of a second pressure under the first opening for moving a subsequent substrate over it a second distance in the third direction which is less than the first distance, such that tilting of the chute places the one and subsequent substrates at transversely spaced-apart positions on the belt, which preclude their overlapping each other.

* * * * *